(12) United States Patent  
Matsumoto et al.

(10) Patent No.: US 7,509,517 B2  
(45) Date of Patent: Mar. 24, 2009

(54) CLOCK TRANSFERRING APPARATUS FOR SYNCHRONIZING INPUT DATA WITH INTERNAL CLOCK AND TEST APPARATUS HAVING THE SAME

(75) Inventors: Junichi Matsumoto, Tokyo (JP); Masahiko Hata, Tokyo (JP)

(73) Assignee: Advantest Corporation, Tokyo (JP)

( * ) Notice: Subject to any disclaimer, the term of this patent is extended or adjusted under 35 U.S.C. 154(b) by 475 days.

(21) Appl. No.: 11/343,949

(22) Filed: Jan. 31, 2006

(65) Prior Publication Data

US 2006/0129868 A1 Jun. 15, 2006

Related U.S. Application Data

(63) Continuation of application No. PCT/JP2004/010319, filed on Jul. 20, 2004.

(30) Foreign Application Priority Data

Jul. 31, 2003 (JP) ............................ 2003-284539

(51) Int. Cl.  
*G06F 1/04* (2006.01)
(52) U.S. Cl. ...................... 713/600; 713/400
(58) Field of Classification Search ................. 713/400, 713/500, 503, 600  
See application file for complete search history.

(56) References Cited

U.S. PATENT DOCUMENTS

| 5,297,869 | A | * | 3/1994 | Benham | .................... 375/361 |
|---|---|---|---|---|---|
| 5,548,249 | A | * | 8/1996 | Sumita et al. | ................ 331/1 A |
| 6,108,793 | A | * | 8/2000 | Fujii et al. | .................. 713/400 |
| 6,137,332 | A | * | 10/2000 | Inoue et al. | ................. 327/256 |
| 6,496,555 | B1 | * | 12/2002 | Soda | .......................... 375/376 |
| 6,538,483 | B2 | * | 3/2003 | Natsume | ..................... 327/144 |
| 6,873,669 | B2 | * | 3/2005 | Nakamura | .................. 713/500 |

FOREIGN PATENT DOCUMENTS

JP 64-65471 3/1989

(Continued)

OTHER PUBLICATIONS

International Search Report issued for PCT/JP2004/010319 mailed on Sep. 14, 2004, 2 pages.

(Continued)

*Primary Examiner*—Chun Cao  
(74) *Attorney, Agent, or Firm*—Osha • Liang LLP

(57) ABSTRACT

There is provided a clock transferring apparatus that outputs input data given in synchronization with a transmission clock in synchronization with an internal clock having a phase different from that of the transmission clock. The clock transferring apparatus includes: a comparison clock generating section that generates a comparison clock of which each clock rising edge or each clock falling edge coincides with substantially middle position on an open part of eye of the corresponding input data based on the transmission clock; an initializing section that controls a phase of the internal clock so that the phase of the internal clock is the substantially same as a phase of the comparison clock; and a data outputting section that receives the internal clock of which the phase is controlled by the initializing section and the input data, synchronizes the input data with the internal clock, and outputs the synchronized data as output data.

7 Claims, 11 Drawing Sheets

FOREIGN PATENT DOCUMENTS

| | | |
|---|---|---|
| JP | 10-164039 | 6/1998 |
| JP | 11-88312 | 3/1999 |
| JP | 2003-18138 | 1/2003 |
| JP | 2003018138 * | 1/2003 |
| JP | 2003121501 A * | 4/2003 |

OTHER PUBLICATIONS

Patent Abstracts of Japan, Publication No. 2003-018138, Publication Date: Jan. 17, 2003, 2 pages.

Patent Abstracts of Japan, Publication No. 10-164039, Publication Date: Jun. 19, 1998, 2 pages.

Patent Abstracts of Japan, Publication No. 64-065471, Publication Date: Mar. 10, 1989, 2 pages.

Patent Abstracts of Japan, Publication No. 11-088312, Publication Date: Mar. 30, 1999, 2 pages.

* cited by examiner

CLOCK TRANSFERRING APPARATUS FOR SYNCHRONIZING INPUT DATA WITH INTERNAL CLOCK AND TEST APPARATUS HAVING THE SAME

CROSS REFERENCE TO THE RELATED APPLICATION

The present application is a continuation application of PCT/JP04/010319 filed on Jul. 20, 2004, which claims priority from a Japanese Patent application No. 2003-284539 filed on Jul. 31, 2003, the entire contents of which are incorporated herein by reference for all purposes.

BACKGROUND OF THE INVENTION

1. Field of the Invention

The present invention relates to a clock transferring apparatus. More particularly, the present invention relates to a clock transferring apparatus that outputs input data given in synchronization with a transmission clock in synchronization with an internal clock having a phase different from that of the transmission clock.

2. Description of Related Art

A test apparatus such as a semiconductor testing apparatus supplies a test pattern to a device under test such as a semiconductor, receives an output signal output from the device under test based on the test pattern, and judges the good or bad of the device under test by comparing the received output signal and an expected value. The output signal output from the device under test includes the variation of a delay amount caused by power supply variation and temperature fluctuation, the manufacture variation of an LSI, a substrate, and a cable. Therefore, the test apparatus receives the output signal output from the device under test by means of an internal clock of the test apparatus that has a small noise. Moreover, since the device under test operates by a clock different from the internal clock of the test apparatus, it is necessary to perform initialization synchronizing a phase of a clock of the device under test with a phase of the internal clock of the test apparatus when receiving the output signal from the device under test. Conventionally, there have been performed delivery and receipt of signals between clocks having phases different from each other by optimizing an arrangement of parts and electric wiring or by using an interleave circuit or a variable delay circuit.

Now, since a related patent document is not recognized, the description is omitted.

However, with speedup of an operation clock of a recent semiconductor device or the like, since a tolerance of setup hold time when delivering and receiving data decreases, it is difficult to guarantee to transfer from a clock to another clock by means of only an arrangement of parts and electric wiring. Moreover, when transferring from a clock to another clock using an interleave circuit, since it is necessary to provide the interleave circuit in all signal lines, the magnitude of circuit increases and also power consumption increases. Furthermore, when transferring from a clock to another clock using a variable delay circuit, since the variable delay circuit has to be provided in all signal lines and a delay amount has to be set in all variable delay circuits, initialization has required time.

SUMMARY OF THE INVENTION

Therefore, it is an object of the present invention to provide a clock transferring apparatus that can solve the foregoing problems. The above and other objects can be achieved by combinations described in the independent claims. The dependent claims define further advantageous and exemplary combinations of the present invention.

To achieve this object, according to the first aspect of the present invention, there is provided a clock transferring apparatus that outputs input data given in synchronization with a transmission clock in synchronization with an internal clock having a phase different from that of the transmission clock. The clock transferring apparatus includes: a comparison clock generating section that generates a comparison clock of which each clock rising edge or each clock falling edge coincides with substantially middle position on an open part of eye of the corresponding input data based on the transmission clock; an initializing section that controls a phase of the internal clock so that the phase of the internal clock is the substantially same as a phase of the comparison clock; and a data outputting section that receives the internal clock of which the phase is controlled by the initializing section and the input data, synchronizes the input data with the internal clock, and outputs the synchronized data as output data.

The clock transferring apparatus may further include an input data acquiring section that generates the input data changed in synchronization with a clock rising edge or a clock falling edge of the transmission clock by acquiring the input data in synchronization with the rising edge or the falling edge of the transmission clock and outputs the generated data to the data outputting section, and the comparison clock generating section may generate the comparison clock of which each clock rising edge or each clock falling edge coincides with substantially middle position on an open part of eye of the input data output from the input data acquiring section by delaying the transmission clock by a half cycle.

The initializing section may include: a judging section that acquires the output data output from the data outputting section in synchronization with the comparison clock and judges a pass or a fail of the output data by comparing the acquired output data and a previously stored expected value of the output data; a phase controlling section that generates a phase setting signal for setting a phase based on the judgment result judged by the judging section; and a phase setting section that sets the phase of the internal clock based on the phase setting signal generated from the phase controlling section, makes the data outputting section output the output data according to the internal clock of which the phase is set, and makes the judging section judge the output data in correspondence with the set phase of the internal clock, and the phase controlling section may sequentially change the phase setting signal to make the phase setting section sequentially change the phase of the internal clock, receive the comparison result by the judging section corresponding to each the changed phase, and stop changing the phase setting signal to substantially accord the phase of the internal clock with the phase of the comparison clock when the judgment result is changed from a pass to a fail.

The phase setting section may include: a reference clock generating section that generates a reference clock of which frequency is an integer multiple of that of the internal clock; a phase change clock generating section that generates a divided reference clock having the substantially same frequency as the internal clock by dividing the reference clock generated from the reference clock generating section, an inverted divided reference clock made by inverting the divided reference clock, and a plurality of phase retardation reference clocks made by delaying a phase of the divided reference clock and a phase of the inverted divided reference clock by one cycle of the reference clock; and a phase change clock selecting section that selects either of the divided reference clock, the inverted divided reference clock, or each of the phase retardation reference clocks generated from the phase change clock generating section based on the phase setting signal received from the phase controlling section, and outputs the selected clock to the data outputting section as the internal clock.

The phase setting section may further generate an input data selecting signal varying in synchronization with the internal clock, the clock transferring apparatus may further include: a rising-time data acquiring section that acquires the input data at a clock rising edge of a dividing transmission clock made by dividing the transmission clock and outputs the input data in synchronization with the clock rising edge of the dividing transmission clock; a falling-time data acquiring section that acquires the input data at a clock falling edge of the dividing transmission clock and outputs the input data in synchronization with the clock falling edge of the dividing transmission clock; and an input data selecting section that alternately selects the input data each output from the rising-time data acquiring section and the falling-time data acquiring section in synchronization with the input data selecting signal varying with the substantially same cycle as that of the dividing transmission clock and outputs the selected input data to the data outputting section, and the comparison clock generating section may delay the transmission clock by one cycle to generate the comparison clock that is alternately located at the substantially middle position on each open part of eye of the input data output from the rising-time data acquiring section and the input data output from the falling-time data acquiring section.

The phase setting section may include: a reference clock generating section that generates a reference clock of which frequency is an integer multiple of that of the internal clock; a phase change clock generating section that generates a divided reference clock having the substantially same frequency as the internal clock by dividing the reference clock generated from the reference clock generating section, an inverted divided reference clock made by inverting the divided reference clock, and a plurality of phase retardation reference clocks made by delaying a phase of the divided reference clock and a phase of the inverted divided reference clock by one cycle of the reference clock; a phase change clock selecting section that selects either of the divided reference clock, the inverted divided reference clock, or the plurality of phase retardation reference clocks generated from the phase change clock generating section based on the phase setting signal received from the phase controlling section, and outputs the selected clock to the data outputting section as the internal clock; a divided phase change clock selecting section that respectively generates divided phase change clocks made by respectively dividing the divided reference clock, the inverted divided reference clock, and the plurality of phase retardation reference clocks generated from the phase change clock generating section, selects either of the plurality of divided phase change clocks based on the phase setting signal received from the phase controlling section, and outputs the selected clock as a selected divided phase change clock; and a selection signal generating section that supplies either of the selected divided phase change clock and an inversion of the selected divided phase change clock output from the divided phase change clock selecting section to the input data selecting section as the input data selecting signal based on the phase setting signal received from the phase controlling section.

According to the second aspect of the present invention, there is provided a test apparatus that tests an electronic device outputting an output signal and a transmission clock synchronized with the output signal. The test apparatus includes: a test pattern generating section that generates a test pattern to test the electronic device; a timing generator that generates a desired timing; a waveform shaping section that shapes a test signal to be input to the electronic device based on the test pattern and the timing generated from the timing generator; a clock transferring section that receives the transmission clock and the output signal and synchronizes the received output signal with an internal clock of the test apparatus having a phase different from that of the transmission clock; and a test judging section that judges the good or bad of the electronic device based on the output signal synchronized with the internal clock by the clock transferring section. The clock transferring section includes: a comparison clock generating section that generates a comparison clock of which each clock rising edge or each clock falling edge coincides with substantially middle position on an open part of eye of the corresponding output signal based on the transmission clock; an initializing section that controls a phase of the internal clock so that the phase of the internal clock is the substantially same as a phase of the comparison clock; and a data outputting section that receives the internal clock of which the phase is controlled by the initializing section and the output signal, synchronizes the output signal with the internal clock, and outputs the synchronized data.

The summary of the invention does not necessarily describe all necessary features of the present invention. The present invention may also be a sub-combination of the features described above.

According to a clock transferring apparatus of the present invention, since it is not necessary to consider the length of a pattern, the length of a cable, and the variation of a process by fitting a phases of a clock by means of a control circuit, it is possible to reduce the number of phases in an interleave circuit. Therefore, it is possible to reduce the number of design processes and power consumption. Moreover, since it is not necessary to provide a variable delay circuit every signal line, it is possible to reduce time necessary for initialization.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
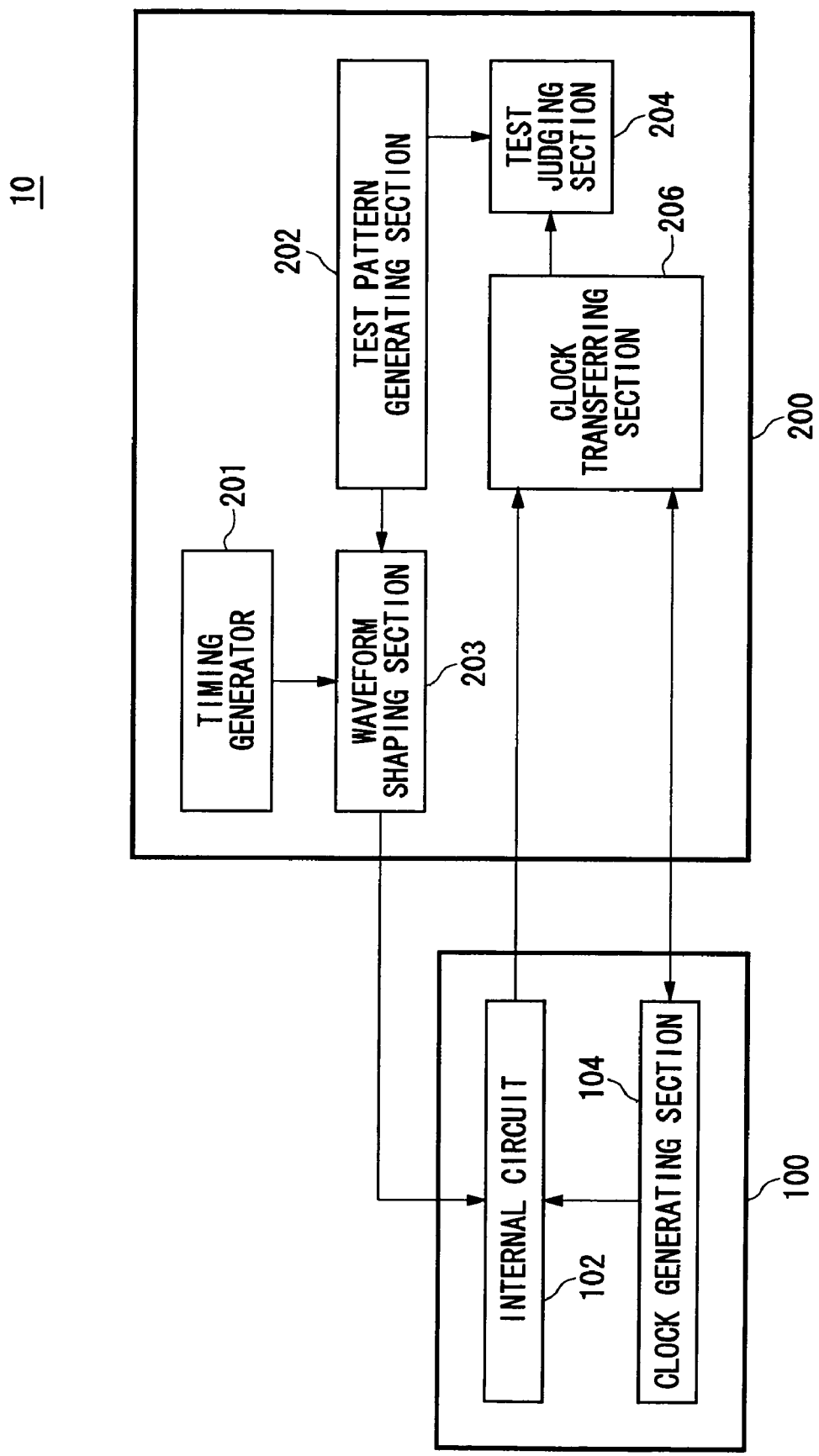
FIG. 1 is a view exemplary showing a configuration of a test system according to an embodiment of the present invention.

FIG. 1 is a view exemplary showing a configuration of a test system 10 according to an embodiment of the present invention. The test system 10 includes a device under test 100 and a test apparatus 200. The device under test 100 is an electronic device such as a semiconductor circuit to be tested. The test apparatus 200 supplies a test pattern to the device under test 100, receives an output signal from the device under test 100 based on the test pattern, and judges the good or bad of the device under test 100 by comparing the output signal with an expected value.

The device under test 100 includes an internal circuit 102 and a clock generating section 104. The clock generating section 104 generates a clock operating the internal circuit 102, and outputs the clock to the internal circuit 102. Moreover, the clock generating section 104 outputs the generated clock to the test apparatus 200 as a transmission clock. Moreover, the clock generating section 104 generates a transmission clock according to a control signal from the test apparatus 200. The internal circuit 102 performs a predetermined process based on the test pattern received from the test apparatus 200, and outputs a process result as an output signal to the test apparatus 200 in synchronization with the transmission clock. Here, synchronization means that phases of signals are matched to each other, in which the phases of signals are different from each other and the signals have the substantially same cycle.

The test apparatus 200 includes a timing generator 201, a test pattern generating section 202, a waveform shaping section 203, a test judging section 204, and a clock transferring section 206. The test pattern generating section 202 generates a test pattern to test the device under test 100. The timing generator 201 generates a desired timing. For example, the timing generator 201 generates a clock with a desired frequency. The waveform shaping section 203 shapes the test signal to be input to the device under test 100 based on the test pattern and the timing generated from the timing generator 201. For example, the test pattern is a pattern shown with digital data. The waveform shaping section 203 outputs a voltage according to the data of the test pattern according to a clock given from the timing generator 201. Moreover, the test pattern generating section 202 generates an expected value of the output signal from the device under test 100 for the generated test pattern, and supplies the generated value to the test judging section 204.

The cock transferring section 206 receives the transmission clock and the output signal of the internal circuit 102 being output in synchronization with the transmission clock. Then, the clock transferring section 206 sends the received output signal to the test judging section 204 in synchronization with an internal clock of the test apparatus 200 having a phase different from that of the transmission clock. The clock transferring section 206 of the present embodiment transfers the output signal received from the device under test 100 to the internal clock of the test apparatus 200 having a phase different from that of the transmission clock of the device under test 100.

In addition, as another configuration, the clock transferring section 206 may be provided inside the device under test 100. In this case, between a plurality of device under tests 100 that operates by clocks having a phase different from one another, an output signal output in synchronization with a transmission clock of a device under test 100 can be transferred to a transmission clock of another device under test 100. As further another configuration, the clock transferring section 206 may respectively be provided inside a plurality of blocks of a device that operates by clocks having a phase different from one another. In this case, in the same device, an output signal output in synchronization with a transmission clock of a block can be transferred to a clock of another block.

Figure 2:
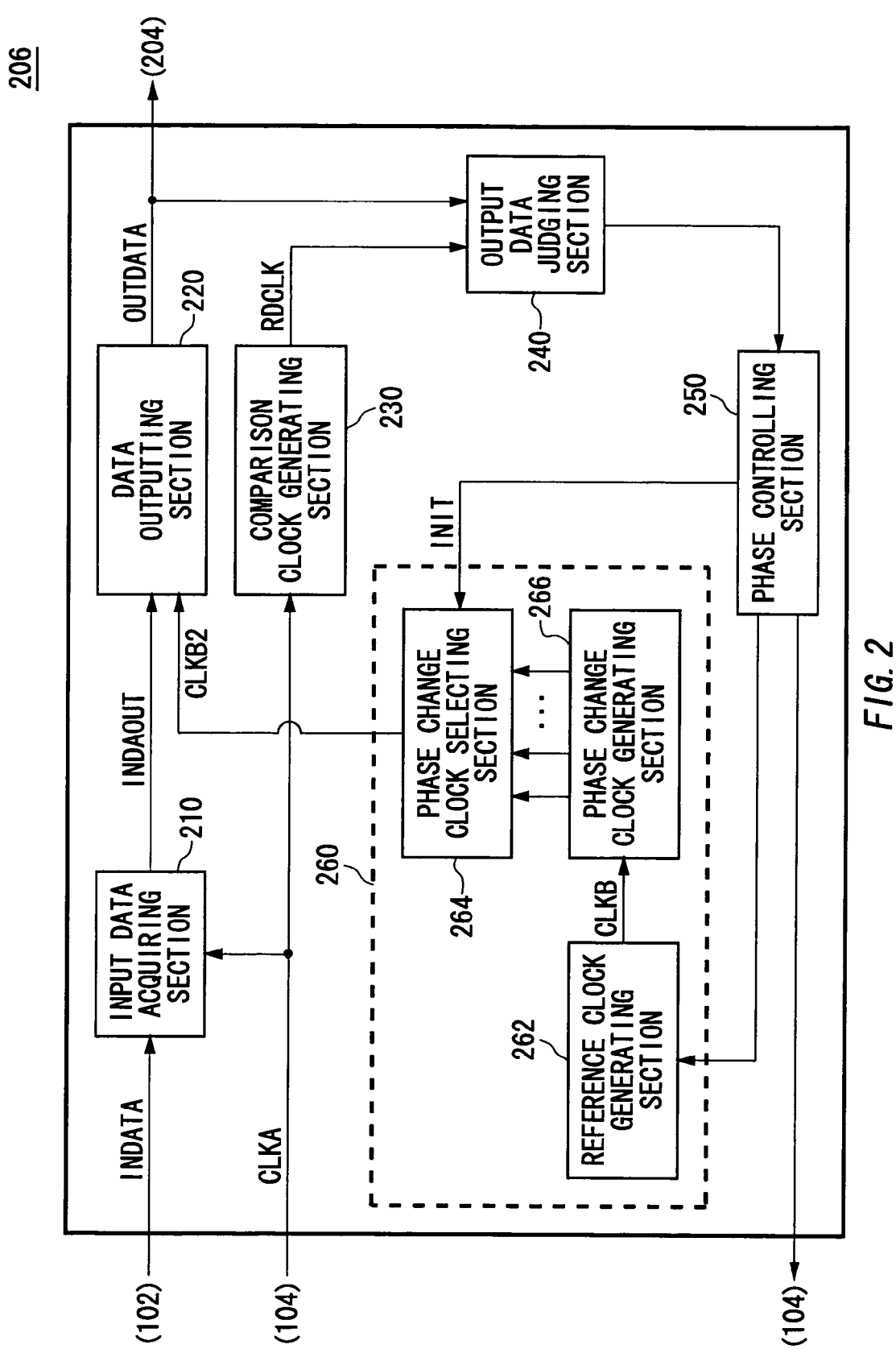
FIG. 2 is a view exemplary showing a configuration of a clock transferring section.

FIG. 2 is a view exemplary showing a configuration of the clock transferring section 206. The clock transferring section 206 includes an input data acquiring section 210, a data outputting section 220, a comparison clock generating section 230, an output data judging section 240, a phase controlling section 250, and a phase setting section 260. Since the input data acquiring section 210 acquires INDATA that is data input from the internal circuit 102 in synchronization with a rising edge or a falling edge of CLKA that is a transmission clock input from the clock generating section 104, the input data acquiring section 210 generates INDAOUT that is input data varying in synchronization with the rising edge or the falling edge of the transmission clock and outputs the generated clock to the data outputting section 220.

The data outputting section 220 acquires the INDAOUT in synchronization with CLKB2 that is a clock having the same cycle as that of the internal clock of the test apparatus 200, and outputs OUTDATA that is data varying in synchronization with a rising edge or a falling edge of the CLKB2. The phase of CLKB2 is previously initialized so that the rising edge or the falling edge is located at the substantially middle position on an open part of eye of the INDAOUT. Here, the open part of eye of the INDAOUT is a period between adjacent data transition periods. The data transition period means that data between adjacent data is a transitioning period, in which adjacent data belong to each data of the INDAOUT corresponding to the rising edge or the falling edge of each the CLKA.

In a normal operation after the initialization, the data outputting section 220 acquires the INDAOUT in synchronization with the CLKB2 set to a predetermined phase for the CLKA, and outputs the OUTDATA to the test judging section 204. By such an operation, when the timing of CLKA varies for the INDATA and the timing of INDAOUT varies for the CLKB2, the data outputting section 220 can acquire the INDAOUT at a position with a maximum margin with respect to the variation of the timing of INDAOUT.

Next, it will be described about an operation of the initialization. The phase controlling section 250 generates INIT that is a phase setting signal setting a phase of the CLKB2. Then, the phase controlling section 250 supplies the INIT to the phase setting section 260 to set a phase of the CLKB2. Moreover, the phase controlling section 250 supplies a control signal to the clock generating section 104 and the phase setting section 260, and generates the CLKA and the CLKB2.

The phase setting section 260 includes a reference clock generating section 262, a phase change clock selecting section 264, and a phase change clock generating section 266. The reference clock generating section 262 generates CLKB of which frequency is a reference clock of an integer multiple of that of the CLKB2 by receiving the control signal from the phase controlling section 250. The phase change clock generating section 266 divides the CLKB generated from the reference clock generating section 262 and inverts and delays the divided clock to generate a plurality of CLKB2 having phases different from one another. The phase change clock selecting section 264 sets a phase of the CLKB2 to be supplied to the data outputting section 220 by selecting either of the plurality of CLKB2 generated from the phase change clock generating section 266 based on the value of INIT received from the phase controlling section 250.

The comparison clock generating section 230 delays the received CLKA by a half cycle to generate RDCLK that is a comparison clock of which each rising edge or each falling edge is located at the substantially middle position on an open part of eye of the INDAOUT. The output data judging section 240 acquires the OUTDATA output from the data outputting section 220 in synchronization with the RDCLK, and judges a pass or a fail of the acquired OUTDATA by comparing the acquired OUTDATA and a previously stored expected value.

The phase controlling section 250 sequentially changes a phase of the CLKB2 set in the phase change clock selecting section 264 to detect a phase in which the judgment result by the output data judging section 240 is changed from a pass to a fail. When the phase controlling section 250 has detected the phase in which the judgment result by the output data judging section 240 is changed from a pass to a fail, the phase controlling section 250 stops the modification of phase being set in the phase change clock selecting section 264 and terminates the initialization operation.

By performing such an initialization operation, when the timing of CLKA varies for the INDATA and the timing of INDAOUT varies for the CLKB2, the data outputting section 220 can acquire the INDAOUT at a position with a maximum margin in regard to the variation of timing of the INDAOUT.

In addition, the output data judging section 240, the phase controlling section 250, and the phase setting section 260 are an example of an initializing section. Moreover, in another example, the initializing section may be provided outside the test apparatus 200. Moreover, in this example, the CLKB is a wave form that has a little noise as compared with the CLKA received from the clock transferring section 206 and is close to a square wave by peaking.

Figure 3:
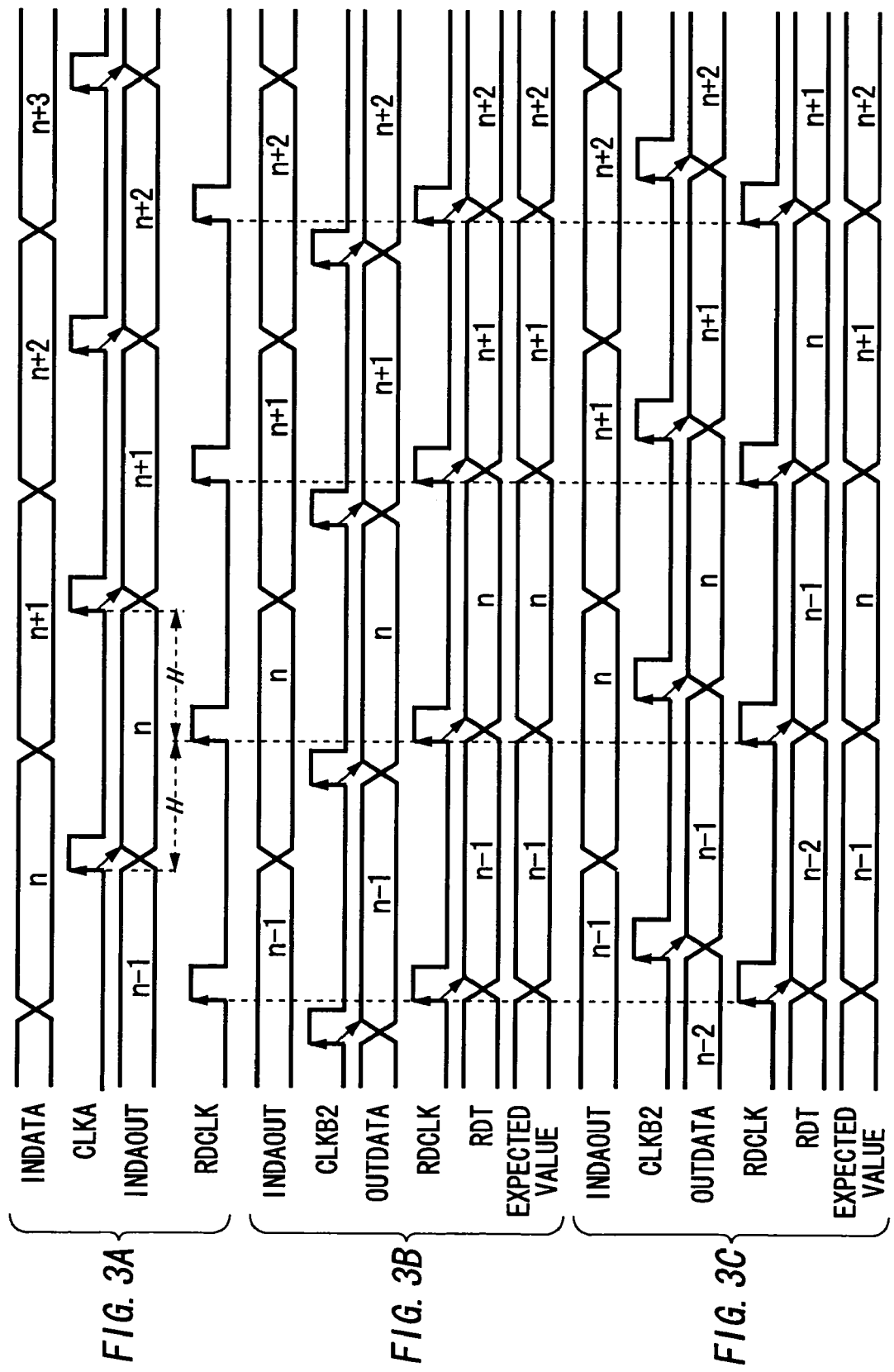
FIGS. 3A to 3C are timing charts exemplary explaining an operation of a clock transferring section.

FIGS. 3A to 3C are timing charts exemplary explaining an operation of the clock transferring section 206. FIG. 3A shows relation between INDATA, CLKA, INDAOUT, and RDCLK. FIG. 3B shows relation between INDAOUT, CLKB2, OUTDATA, RDCLK, RDT, and an expected value when the output data judging section 240 has judged a pass. FIG. 3C shows relation between INDAOUT, CLKB2, OUTDATA, RDCLK, RDT, and an expected value when the output data judging section 240 has judged a fail. In this example, the input data acquiring section 210 acquires the INDATA at the timing of the rising edge of the CLKA, the data outputting section 220 acquires the INDAOUT at the timing of the rising edge of the CLKB2, and the output data judging section 240 acquires the OUTDATA at the timing of the rising edge of the RDCLK. In addition, the RDT is OUTDATA acquired at the timing of the rising edge of the RDCLK.

In FIG. 3A, since the comparison clock generating section 230 delays the CLKA by a half cycle, the rising edge of RDCLK is located at the substantially middle position on an open part of eye of the INDAOUT. In FIG. 3B, the data outputting section 220 acquires the INDAOUT in synchronization with the CLKB2 of which a phase advances by a predetermined amount in reference to the RDCLK, and outputs the OUTDATA. Then, the output data judging section 240 compares the acquired RDT with an expected value. In this example, since the phase of CLKB2 advances compared to the RDCLK, the RDT is identical with the expected value and is judged to be a pass.

In FIG. 3C, the output data judging section 240 acquires the INDAOUT in synchronization with the CLKB2 of which a phase is delayed by a predetermined amount compared to the RDCLK, and outputs the OUTDATA. Then, the output data judging section 240 compares the acquired RDT with an expected value. In this example, since the phase of CLKB2 is delayed compared to the RDCLK, the RDT is delayed and output by one cycle of the RDCLK compared to the expected value. Therefore, since the RDT is not identical with the expected value, the RDT is judged to be a fail. In this manner, in the initialization synchronizing the phase of CLKB2 with the phase of RDCLK, since the phase of CLKB2 is continuously changed in a delay direction in regard to the RDCLK, the judgment result by the output data judging section 240 is changed from a pass to a fail using a phase at which the CLKB2 and the RDCLK are identical with each other as a bound.

The phase controlling section 250 changes the value of INIT to make the phase setting section 260 sequentially change the phase of CLKB2 in a direction delayed for the RDCLK. Then, the phase controlling section 250 receives the judgment result by the output data judging section 240 corresponding to each of the changed phases, and stops modifying the value of INIT when the judgment result has been changed from a pass to a fail. In this way, the phase controlling section 250 substantially uniforms the phase of CLKB2 and the phase of RDCLK. In this case, the rising edge of the CLKB2 is located at the substantially middle position on an open part of eye of the INDAOUT. In this way, the timing of CLKA varies after the initialization, and the data outputting section 220 can acquire the INDAOUT at a position with a maximum margin in regard to the variation of the timing of INDAOUT when the timing of INDAOUT varies for the CLKB2.

In addition, the phase of RDCLK and the phase of CLKB2 can be matched with high precision by finely controlling the change of the phase of CLKB2. Moreover, it is necessary that resolution when the phase of CLKB2 is changed satisfies the following relationship in regard to a data section of the INDATA corresponding to each the rising edge of the CLKA and the fluctuation including the variation of the timing of CLKA for the INDATA and the variation of the timing of CLKB for the CLKA.

Data Section—Fluctuation>Resolution

In this way, when the phase of CLKB2 has been changed, each rising edge of the CLKB2 is generated at least once time in a section obtained by subtracting the fluctuation from each data interval.

Figure 4:
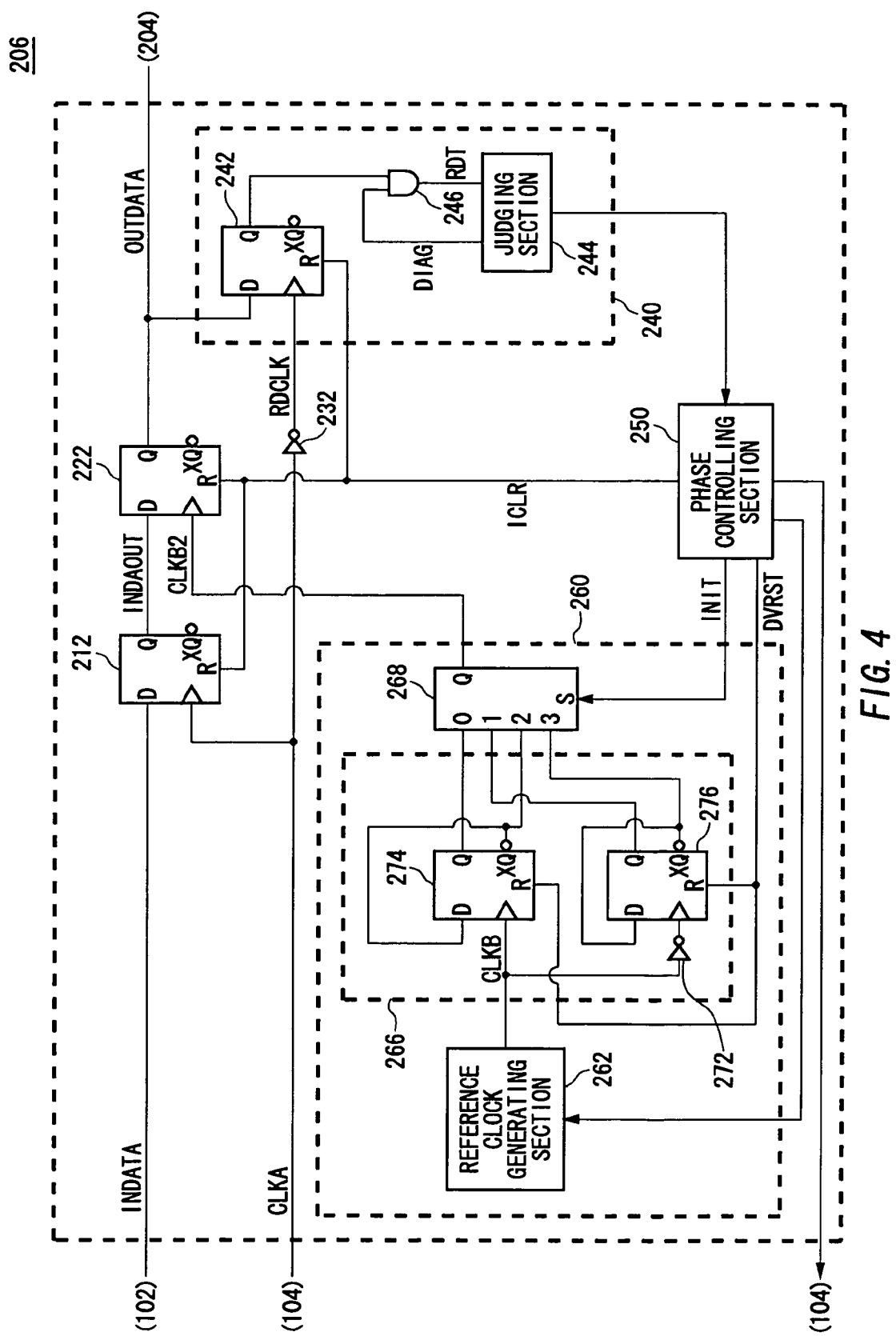
FIG. 4 is a view exemplary showing a circuit configuration of a clock transferring section in a one-way process.

FIG. 4 is a view exemplary showing a circuit configuration of the clock transferring section 206 in a one-way process. The clock transferring section 206 includes a plurality of flip-flops 212 and 222 and an inverter 232. The flip-flop 212 acquires the INDATA at the timing of the rising edge of the CLKA, and outputs the INDAOUT. The flip-flop 222 acquires the INDAOUT at the timing of the rising edge of the CLKB2, and outputs the OUTDATA. The inverter 232 generates the RDCLK obtained by delaying the CLKA by a half cycle by inverting the CLKA.

In addition, the plurality of flip-flops 212 and 222 are an example of the input data acquiring section 210 and the data outputting section 220 each described in FIG. 2. The inverter 232 is an example of the comparison clock generating section 230. Moreover, in this example, the CLKA has, e.g., frequency of 266 MHz and a duty ratio of 50%. Moreover, in this example, the CLKB has, e.g., frequency of 533 MHz and a duty ratio of 50%.

The output data judging section 240 includes a flip-flop 242, a judging section 244, and an AND gate 246. The flip-flop 242 acquires the OUTDATA at the rising edge of the RDCLK. The AND gate 246 receives the OUTDATA acquired by the flip-flop 242, and sends the OUTDATA acquired according to a DIAG signal acquired from the judging section 244 to the judging section 244 as RDT. The judging section 244 judges a pass or a fail by comparing the RDT received from the AND gate 246 with an expected value.

The phase change clock generating section 266 includes an inverter 272 and a plurality of flip-flops 274 and 276. An XQ terminal of the flip-flop 274 is connected to a D terminal of the flip-flop 274. The flip-flop 274 receives the CLKB generated from the reference clock generating section 262 through a clock input terminal. Then, whenever the flip-flop 274 receives the rising edge of the CLKB, the flip-flop 274 reflects the state of D terminal on a Q terminal and an inversion of the state of D terminal on the XQ terminal. In this way, the flip-flop 274 generates a divided reference clock obtained by dividing the frequency of CLKB by two, and outputs the generated clock from the Q terminal. Moreover, the flip-flop 274 generates an inverted divided reference clock made by inverting the divided reference clock generated through the Q terminal, and outputs the generated clock from the XQ terminal.

An XQ terminal of the flip-flop 276 is connected to a D terminal of the flip-flop 276, and receives an inversion of the CLKB, which is generated from the reference clock generating section 262 to a clock input terminal, via the inverter 272. Then, whenever the flip-flop 276 receives a rising edge through the clock input terminal, the flip-flop 276 reflects the state of D terminal on a Q terminal and an inversion of the state of D terminal on the XQ terminal. In this way, the flip-flop 276 generates a phase retardation reference clock made by delaying a divided reference clock output from the Q terminal of the flip-flop 274 by a half cycle of the CLKB, and outputs the generated clock through the Q terminal. Moreover, the flip-flop 276 generates a phase retardation reference clock made by delaying an inverted divided reference clock generated from the XQ terminal of the flip-flop 274 by a half cycle of the CLKB, and outputs the generated clock through the XQ terminal.

The phase setting section 260 includes a multiplexer 268. The multiplexer 268 is an example of the phase change clock selecting section 264. The multiplexer 268 receives the divided reference clock, the inverted divided reference clock, and the plurality of phase retardation reference clocks each generated from the plurality of flip-flops 274 and 276 through the terminals 0 to 3. Then, the phase setting section 260 outputs a clock of a terminal based on the value of INIT received from the phase controlling section 250 to the flip-flop 222 as the CLKB2.

The phase controlling section 250 further generates ICLR resetting the plurality of flip-flops 212, 222, and 242 and DVRST resetting the plurality of flip-flops 274 and 276. Moreover, the phase controlling section 250 holds the previous judgment result by the judging section 244 and compares the result with the present judgment result to detect the change of the judgment result from a pass to a fail.

In addition, when the CLKA and the CLKB have the same frequency, since a variable delay circuit is used in place of the inverter 272 and the plurality of flip-flops 274 and 276 of the phase change clock generating section 266, the phase of CLKB2 can be adjusted for the INDAOUT according to a delay amount set in the variable delay circuit.

Figure 5:
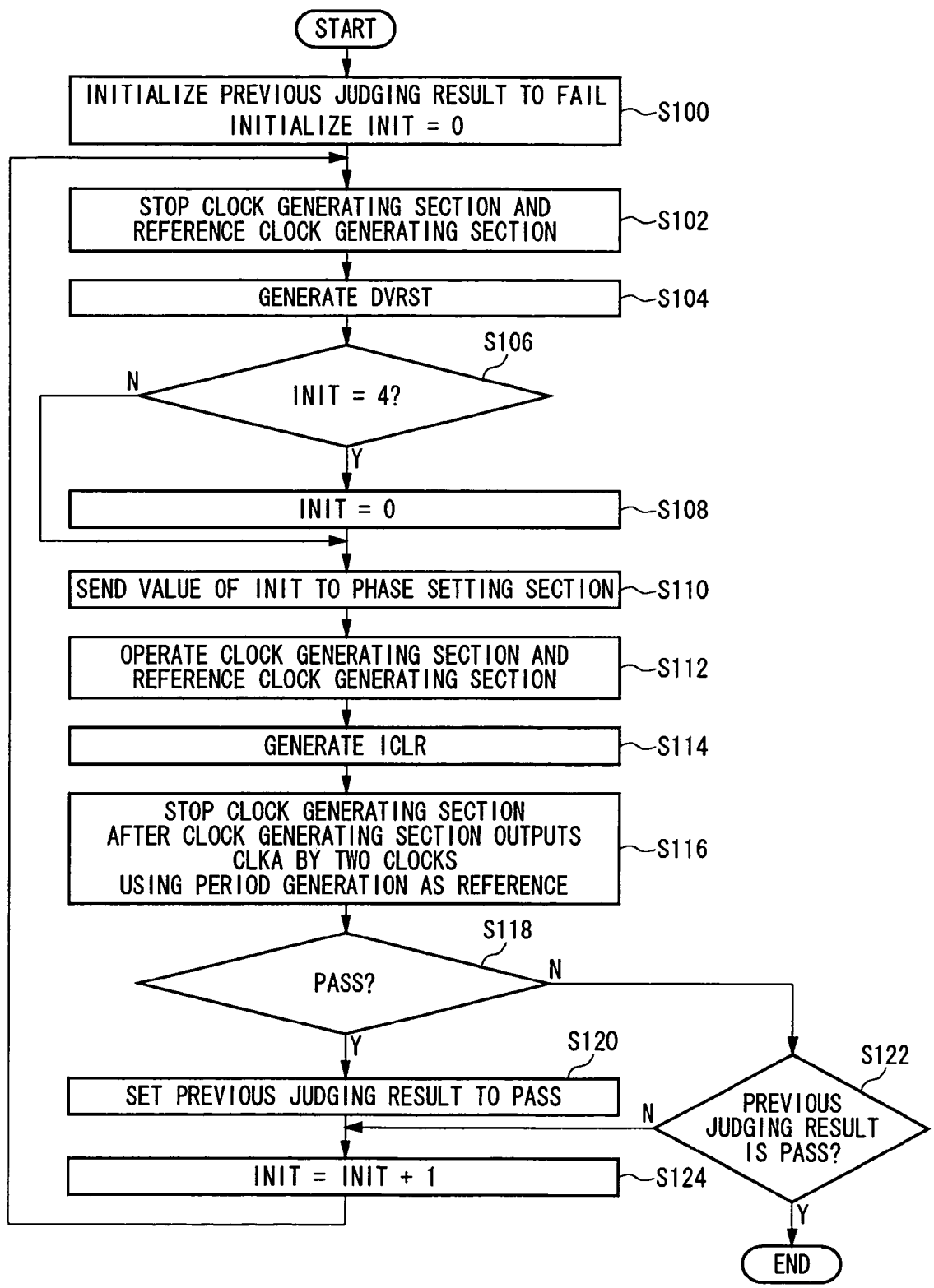
FIG. 5 is a flowchart exemplary showing an initialization operation of a clock transferring section.

FIG. 5 is a flowchart exemplary showing an initialization operation of the clock transferring section 206. At first, the phase controlling section 250 respectively initializes the previous judgment result to a fail and the value of INIT to zero (S100). Next, the phase controlling section 250 supplies a control signal to the clock generating section 104 and the reference clock generating section 262, and respectively stops the CLKA and the CLKB (S102). Then, the phase controlling section 250 generates the DVRST, and resets the plurality of flip-flops 274 and 276 (S104). Next, the phase controlling section 250 judges whether the value of INIT is four (S106). When the value of INIT is not four (S106: No), the phase controlling section 250 sends INIT with the set value to the phase setting section 260 (S110).

When the value of INIT is four (S106: Yes), the phase controlling section 250 sets the value of INIT to zero (S108). Then, the phase controlling section 250 sends INIT with the set value to the phase setting section 260 (S110). Next, the phase controlling section 250 supplies a control signal to the clock generating section 104 and the reference clock generating section 262 in order to again generate the CLKA and the CLKB (S112). Next, the phase controlling section 250 generates ICLR and resets the plurality of flip-flops 212, 222, and 242 (S114). Then, the phase controlling section 250 outputs the CLKA, e.g., by two clocks to the clock generating section 104 using the generation of a periodic test signal PERIOD as a standard, and again stops the CLKA (S116).

The judging section 244 receives the RDT by turning the DIAG into High. Then, the judging section 244 judges whether the RDT is a pass by comparing the received RDT and the expected value (S118). When it has been judged that the RDT is a pass (S118: Yes), the phase controlling section 250 sets the previous judgment result to a pass (S120), adds one to the value of INIT (S124), and stops the CLKA and the CLKB again (S102).

When it has not been judged that the RDT is a pass (S118: No), the phase controlling section 250 judges whether the previous judgment result of the RDT is a pass (S122). When the previous judgment result of the RDT has not been a pass (S122: No), the phase controlling section 250 adds one to the value of INIT (S124) and stops the CLKA and the CLKB again (S102). When the previous judgment result of the RDT has been a pass (S122: Yes), the initialization operation of the clock transferring section 206 shown in this flowchart is terminated.

Figure 6:
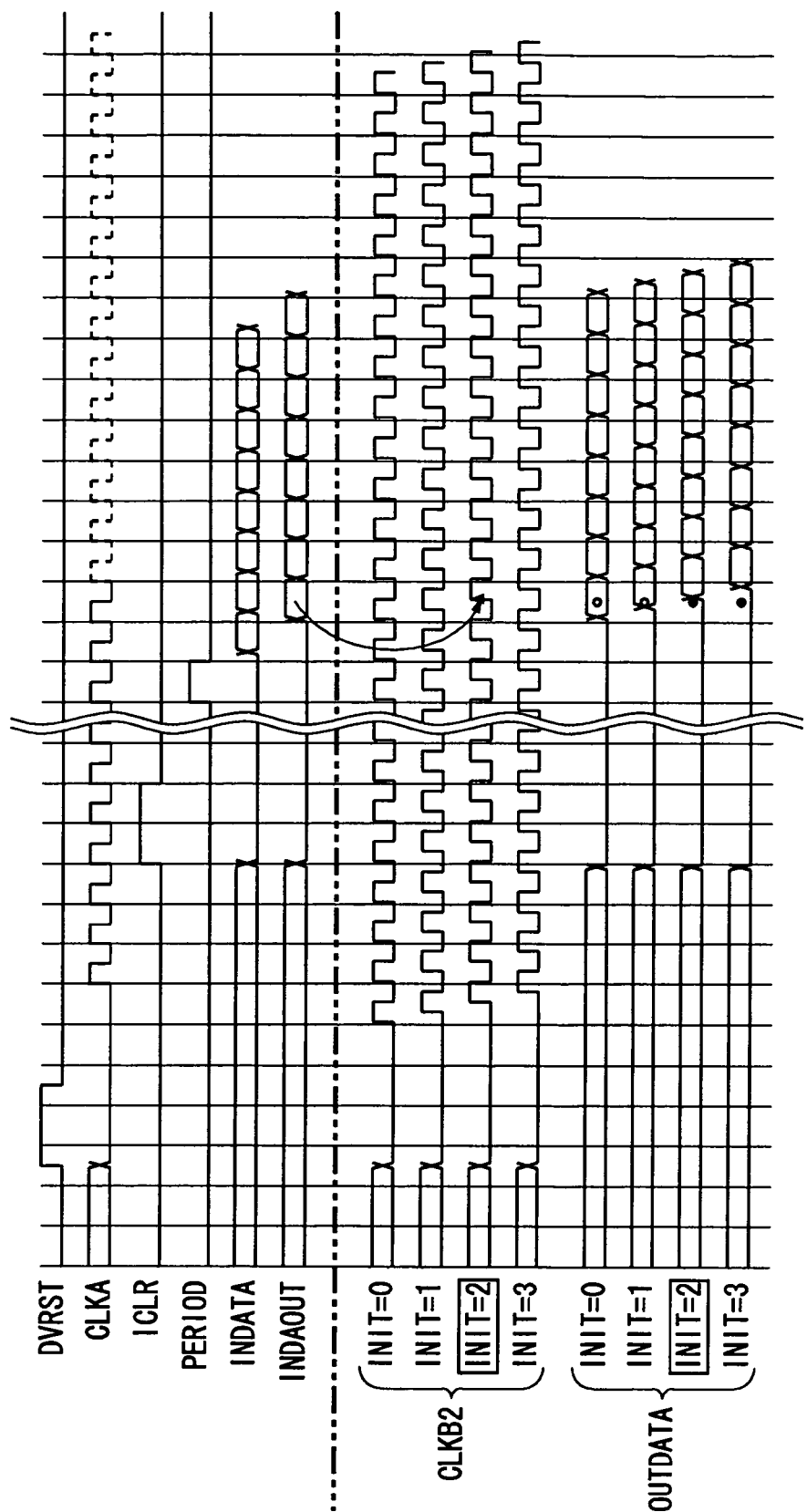
FIG. 6 is a timing chart explaining an initialization operation of a clock transferring section when a phase of CLKA and a phase of CLKB2 are most deviated from each other.

FIG. 6 is a timing chart explaining an initialization operation of the clock transferring section 206 when the phase of CLKA and the phase of CLKB2 are most deviated from each other. In the present drawing, ○ attached to OUTDATA shows a pass and ● attached to the OUTDATA shows a fail. In this example, when the phase controlling section 250 changes the value of INIT from one to two to change the phase of CLKB2, the decision of the judging section 244 is changed from a pass to a fail. The phase controlling section 250 sets the value of INIT to two, and terminates the initialization operation.

Figure 7:
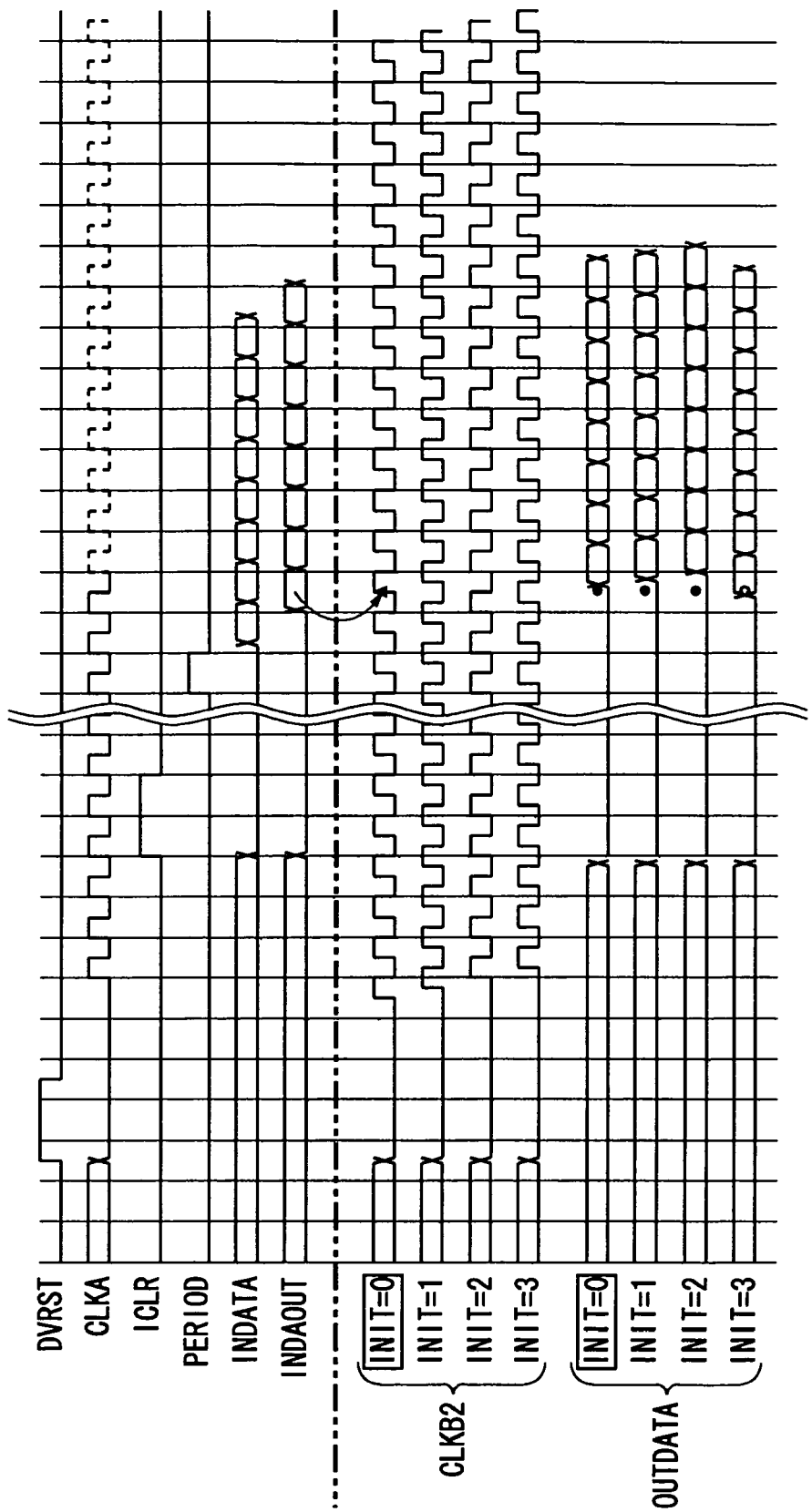
FIG. 7 is a timing chart explaining an initialization operation of a clock transferring section when a phase of CLKA and a phase of CLKB2 are deviated from each other by a half cycle.

FIG. 7 is a timing chart explaining an initialization operation of the clock transferring section 206 when the phase of CLKA and the phase of CLKB2 are deviated from each other by a half cycle. In this example, when the value of a first INIT is zero, the phase controlling section 250 detects a fail of the RDT. However, since the phase controlling section 250 has initialized the previous judgment result of the RDT to be a fail, the phase controlling section 250 does not detect the change from a pass to a fail. Then, when the value of INIT is three, the phase controlling section 250 receives a pass decision from the judging section 244. After that, the phase controlling section 250 receives a judgment result for the RDT when the value of INIT is zero, in order to detect the change from a pass to a fail. The phase controlling section 250 sets the value of INIT to zero, and terminates the initialization operation.

Figure 8:
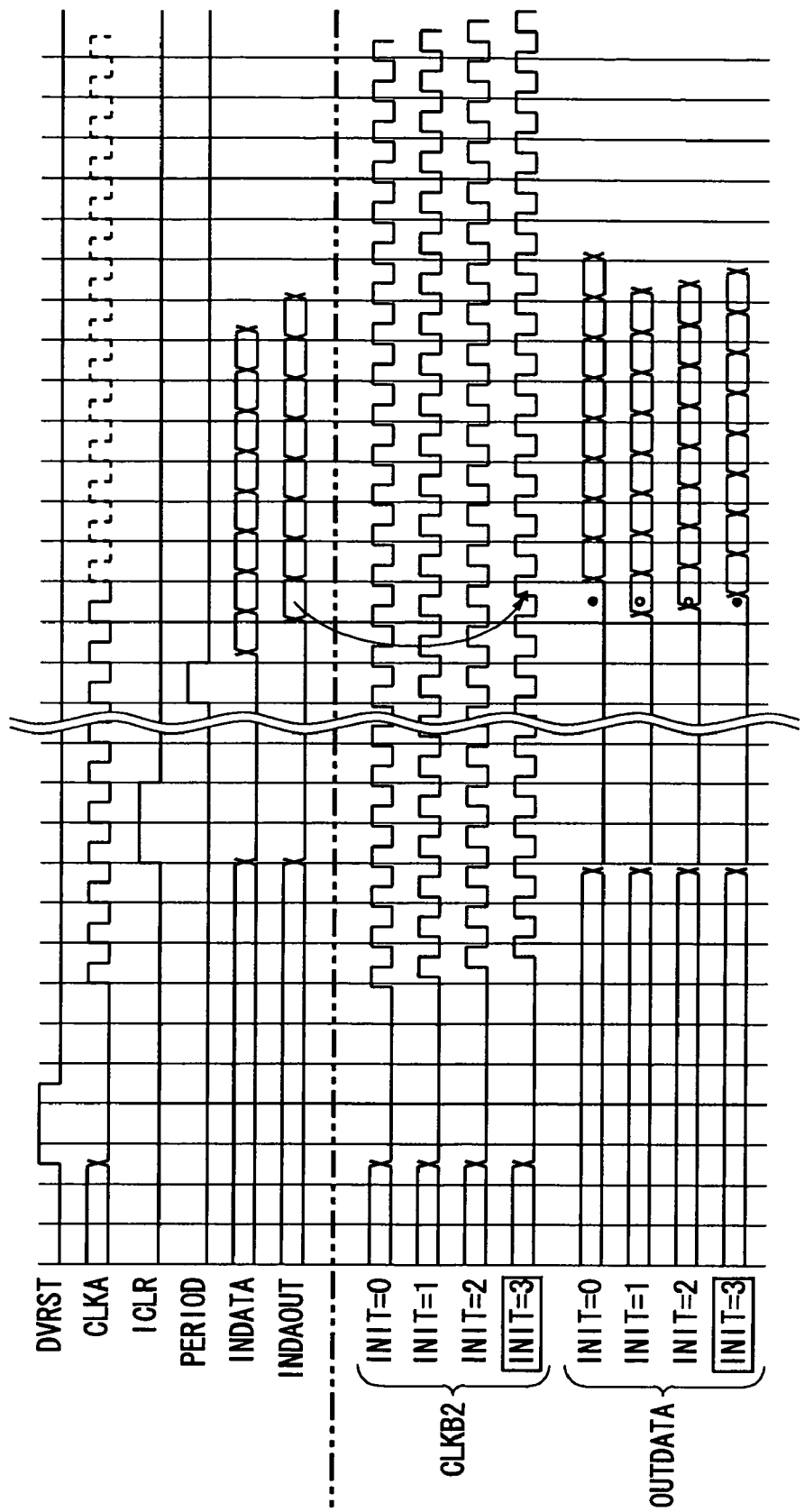
FIG. 8 is a timing chart explaining an initialization operation of a clock transferring section when a phase of CLKA and a phase of CLKB2 come closest to each other.

FIG. 8 is a timing chart explaining an initialization operation of the clock transferring section 206 when the phase of CLKA and the phase of CLKB2 come closest to each other. In this example, when the phase controlling section 250 changes the value of INIT from two to three to change the phase of CLKB2, the decision of the judging section 244 is changed from a pass to a fail. The phase controlling section 250 sets the value of INIT to three, and terminates the initialization operation. In each case of FIGS. 6 to 8, after terminating the initialization, the rising edge of the CLKB2 is located at the substantially middle position on the open part of eye of the INDAOUT.

Figure 9:
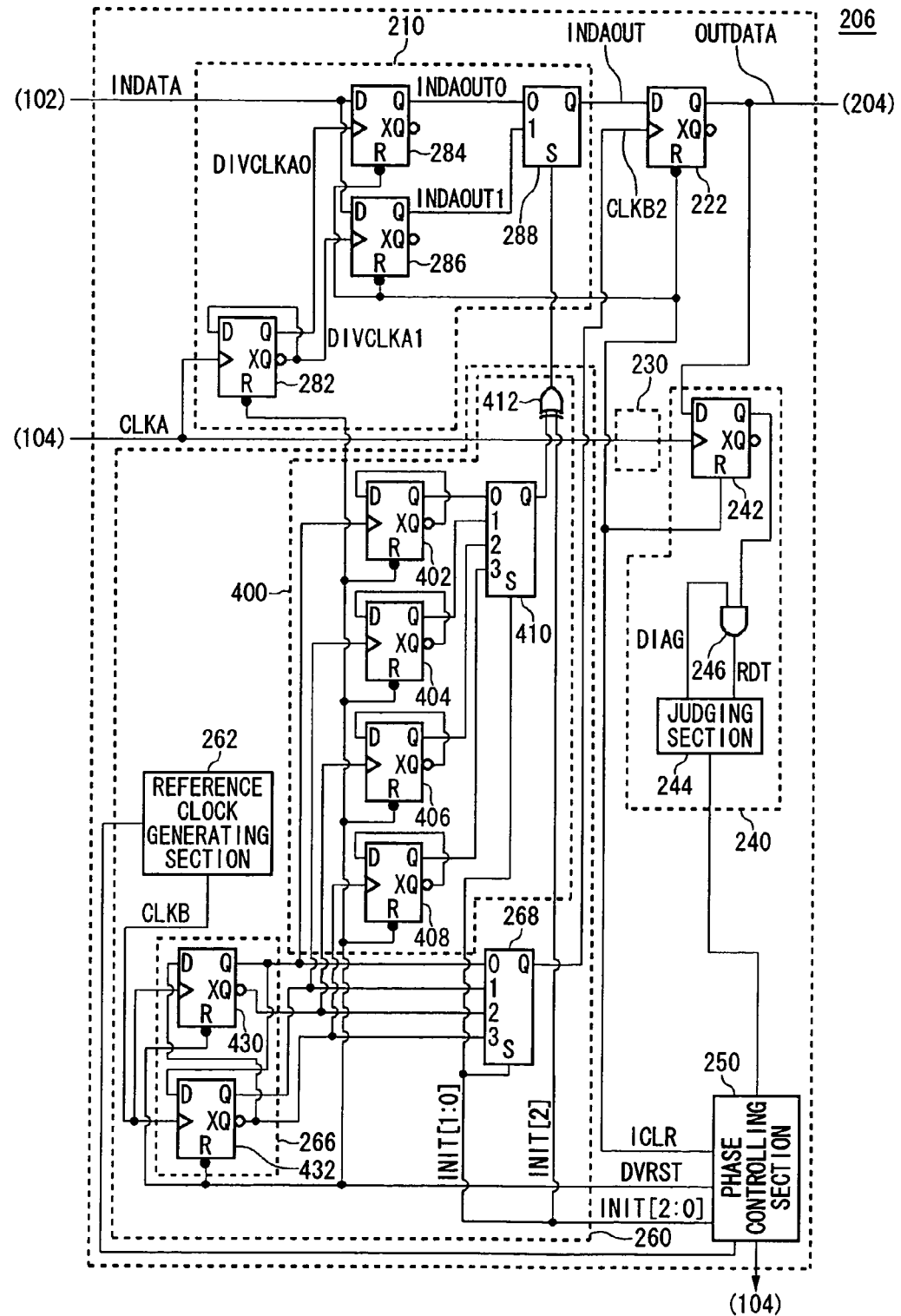
FIG. 9 is a view exemplary showing a circuit configuration of a clock transferring section in a two-way process.

FIG. 9 is a view exemplary showing a circuit configuration of the clock transferring section 206 in a two-way process. The phase setting section 260 further outputs an input data selecting signal varying in synchronization with the CLKB2. In this example, the frequency of CLKA and CLKB2 is 266 MHz, the frequency of CLKB is 1.066 GHz, and the frequency of the input data selecting signal is 133 MHz. In this example, the frequency of CLKB is four times of the frequency of CLKB2. In this example, the CLKA, the CLKB, the CLKB2, and the input data selecting signal have a duty ratio of 50%. Moreover, in this example, the INIT generated from the phase controlling section 250 is three bits. The value of three bits of INIT corresponds to either of the input data selecting signals that are set to eight kinds of phases by the phase setting section 260. The value of low-order two bits of INIT corresponds to either of each CLKB2 that is set to four kinds of phases by the phase setting section 260.

The input data acquiring section 210 includes a plurality of flip-flops 282, 284, and 286, and a multiplexer 288. An XQ terminal of the flip-flop 282 is connected to a D terminal of the flip-flop 282. The flip-flop 282 receives CLKA through a clock input terminal. Then, whenever the flip-flop 282 receives a rising edge of the CLKA, the flip-flop 282 reflects the state of D terminal on a Q terminal and an inversion of the state of D terminal on the XQ terminal. In this way, the flip-flop 282 supplies DIVCLKA0 obtained by dividing the CLKA by two to a clock input terminal of the flip-flop 284 and DIVCLKA1 obtained by delaying the DIVCLKA0 by a half cycle to a clock input terminal of the flip-flop 286.

The flip-flop 284 acquires INDATA at the timing of a rising edge of the DIVCLKA0, and outputs INDAOUT0 in synchronization with the rising edge of the DIVCLKA0. The flip-flop 286 acquires the INDATA at the timing of a rising edge of the DIVCLKA1, and outputs INDAOUT1 in synchronization with the rising edge of the DIVCLKA1. In this manner, the flip-flop 284 and the flip-flop 286 alternately acquire the INDATA at the timing of the rising edge of the DIVCLKA0 and DIVCLKA1 that are the frequency of one-half of the CLKA, and each output the INDAOUT0 and the INDAOUT1.

The multiplexer 288 selects the INDAOUT1 when the input data selecting signal is a High state and the INDAOUT0 when the input data selecting signal is a Low state, and outputs the selected one as INDAOUT, in synchronization with the input data selecting signal received from the phase setting section 260. In addition, the input data selecting signal varies with the substantially same cycle as that of the DIVCLKA0 and DIVCLKA1. Here, the phase of the input data selecting signal is previously initialized so that the rising edge and the falling edge are located at the substantially middle positions on open parts of eye of the INDAOUT0 and the INDAOUT1. Moreover, the phase of the CLKB2 is previously initialized so that the rising edge is alternately located at the substantially middle position on an open part of eye of the INDAOUT0 and the INDAOUT1.

In a normal operation after the initialization, the multiplexer 288 alternately selects the INDAOUT0 and the INDAOUT1 in synchronization with the input data selecting signal, and outputs the selected one to the flip-flop 222 as the INDAOUT. The flip-flop 222 acquires the INDAOUT in synchronization with the CLKB2, and outputs OUTDATA to the test judging section 204. By such an operation, when the timing of CLKA is changed and the timings of the INDAOUT0 and INDAOUT1 are changed for the rising edge and the falling edge of the input data selecting signal after the initialization, the multiplexer 288 can output the INDAOUT at a position with a maximum margin in regard to the variation of the timing of the INDAOUT0 and INDAOUT1. Similarly, the flip-flop 222 can acquire the INDAOUT at a position with a maximum margin for the variation of the timing of the INDAOUT0 and INDAOUT1.

The comparison clock generating section 230 delays the CLKA by one cycle to generate RDCLK alternately located at the substantially middle position on an open part of eye of each of the INDAOUT0 and the INDAOUT1. The phase change clock generating section 266 include a plurality of flip-flops 430 and 432. A D terminal of the flip-flop 430 is connected to an XQ terminal of the flip-flop 432 and a Q terminal of the flip-flop 430 is connected to a D terminal of the flip-flop 432. Each of the flip-flop 430 and the flip-flop 432 receives the CLKB generated from the reference clock generating section 262 through each clock input terminal.

Whenever receiving the rising edge of CLKB, the flip-flop 430 reflects the state of D terminal on the Q terminal, outputs a divided reference clock obtained by dividing the CLKB by four from the Q terminal, and outputs an inverted divided reference clock obtained by inverting the divided reference clock from the XQ terminal. Moreover, the flip-flop 432 outputs a phase retardation reference clock, which is obtained by delaying the divided reference clock of the Q terminal of the flip-flop 430 by one cycle of the CLKB, from the Q terminal. Moreover, the flip-flop 432 outputs a phase retardation reference clock, which is obtained by delaying the inverted divided reference clock of the XQ terminal of the flip-flop 430 by one cycle of the CLKB, from the XQ terminal.

The multiplexer 268 each receives the divided reference clock, the inverted divided reference clock, and the plurality of phase retardation reference clocks each generated from the plurality of flip-flops 430 and 432 through the terminals 0 to 3. Then, the multiplexer 268 outputs a clock of a terminal according to the value of low-order two bits of INIT received from the phase controlling section 250 to the flip-flop 222 as the CLKB2.

The phase setting section 260 further includes a selection signal generating section 400. The selection signal generating section 400 includes a plurality of flip-flops 402, 404, 406, and 408, a multiplexer 410, and an exclusive OR circuit 412. An XQ terminal of the flip-flop 402 is connected to a D terminal of the flip-flop 402. The flip-flop 402 receives the divided reference clock generated from the flip-flop 430 through a clock input terminal. Then, whenever receiving a rising edge of the divided reference clock, the flip-flop 402 reflects the state of D terminal on a Q terminal and reflects an inversion of the state of D terminal on a XQ terminal. In this way, the flip-flop 402 generates a clock made by dividing the divided reference clock by two, and sends the generated clock to the terminal 0 of the multiplexer 410.

Similarly, the flip-flop 404 generates a clock made by dividing the phase retardation reference clock output from the Q terminal of the flip-flop 432 by two, and sends the generated clock to the terminal 1 of the multiplexer 410. The flip-flop 406 generates a clock made by dividing the inverted divided reference clock output from the XQ terminal of the flip-flop 430 by two, and sends the generated clock to the terminal 2 of the multiplexer 410. The flip-flop 408 generates a clock made by dividing the phase retardation reference clock output from the XQ terminal of the flip-flop 432 by two, and sends the generated clock to the terminal 3 of the multiplexer 410.

The multiplexer 410 outputs a clock of a terminal based on the value of low-order two bits of INIT received from the phase controlling section 250 to the exclusive OR circuit 412. The exclusive OR circuit 412 outputs the output from the multiplexer 410 to the multiplexer 288 as an input data selecting signal when the value of high-order one bit of INIT received from the phase controlling section 250 is zero, and inverts the output from the multiplexer 410 to output the inverted one to the multiplexer 288 as an input data selecting signal when the value of high-order one bit of INIT is one. In addition, the plurality of flip-flops 402, 404, 406, and 408 and the multiplexer 410 are an example of a divided phase change clock selecting section. Moreover, the exclusive OR circuit 412 is an example of a selection signal generating section.

Here, in an initialization operation, the multiplexer 268 outputs either of the divided reference clock, the inverted divided reference clock, and the plurality of phase retardation reference clocks each generated from the plurality of flip-flops 430 and 432 as the CLKB2 according to the value of low-order two bits of INIT from the phase controlling section 250. The multiplexer 410 selects a clock made by dividing the clock selected by the multiplexer 268 by two according to the value of low-order two bits of INIT from the phase controlling section 250, and outputs the selected clock to the exclusive OR circuit 412. The exclusive OR circuit 412 inverts the clock received from the multiplexer 410 to supply the inverted clock to the multiplexer 268 according to the value of high-order one bit of INIT from the phase controlling section 250.

Then, the phase controlling section 250 supplies a control signal to the clock generating section 104 and the reference clock generating section 262, and generates the CLKA and the CLKB. The flip-flop 284 and the flip-flop 286 alternately acquire the INDATA at the timings of rising edges of DIVCLKA0 and DIVCLKA1 that are the frequency of one-half of the CLKA, and respectively outputs INDAOUT0 and INDAOUT1. Then, the multiplexer 288 alternately selects the INDAOUT0 and the INDAOUT1 in synchronization with the input data selecting signal set to a predetermined phase for the CLKA, and outputs the selected one to the flip-flop 222 as INDAOUT. The flip-flop 222 acquires the INDAOUT in synchronization with the CLKB2 set to a predetermined phase for the CLKA, and outputs OUTDATA.

The flip-flop 242 acquires the OUTDATA in synchronization with the RDCLK. The judging section 244 receives the OUTDATA acquired by the flip-flop 242 as RDT by supplying a DIAG signal to the AND gate 246. Then, the judging section 244 compares the RDT and an expected value, and judges a pass or a fail of the RDT. The phase controlling section 250 receives the result made by judging the OUTDATA acquired by the output data judging section 240. The phase controlling section 250 sequentially changes the phases of the CLKB2 and the input data selecting signal by sequentially changing the values of INIT set in the plurality of multiplexers 268 and 410 and the exclusive OR circuit 412. In this way, the phase controlling section 250 detects the phase of the CLKB2 in which the judgment result by the output data judging section 240 is changed from a pass to a fail.

When detecting the phase in which the judgment result by the output data judging section 240 is changed from a pass to a fail, the phase controlling section 250 stops the modification of phase of the CLKB2 being set in the phase change clock selecting section 264 and terminates the initialization operation. After terminating the initialization operation, the multiplexer 288 alternately selects the INDAOUT0 and the INDAOUT1 in synchronization with the input data selecting signal of the phase corresponding to the value of the set INIT, and outputs the INDAOUT. Moreover, in synchronization with the CLKB2 of the phase corresponding to the value of the set INIT, the flip-flop 222 acquires the INDAOUT, and outputs the OUTDATA to the test judging section 204 in synchronization with the CLKB2. Therefore, in this example, the rising edge of CLKB2 can be matched to the substantially middle position on each open part of eye of the INDAOUT0 and the INDAOUT1.

In addition, in this example, the initialization operation described in FIG. 5 can be applied. In this case, in step 106, the phase controlling section 250 judges whether the value of INIT is seven. Moreover, in step 116, the phase controlling section 250 outputs the CLKA to the clock generating section 104, e.g., by three clocks using the generation of PERIOD as a standard, and stops the CLKA again.

In addition, when the CLKA and the CLKB have the same frequency, the phase of CLKB can be adjusted by using a variable delay circuit in the phase change clock generating section 266 and the selection signal generating section 400. When a margin can be ensured by means of an interleave circuit, the phase of CLKB2 can be adjusted by switching the CLKB and the inversion of CLKB as the input data selecting signal.

Figure 10:
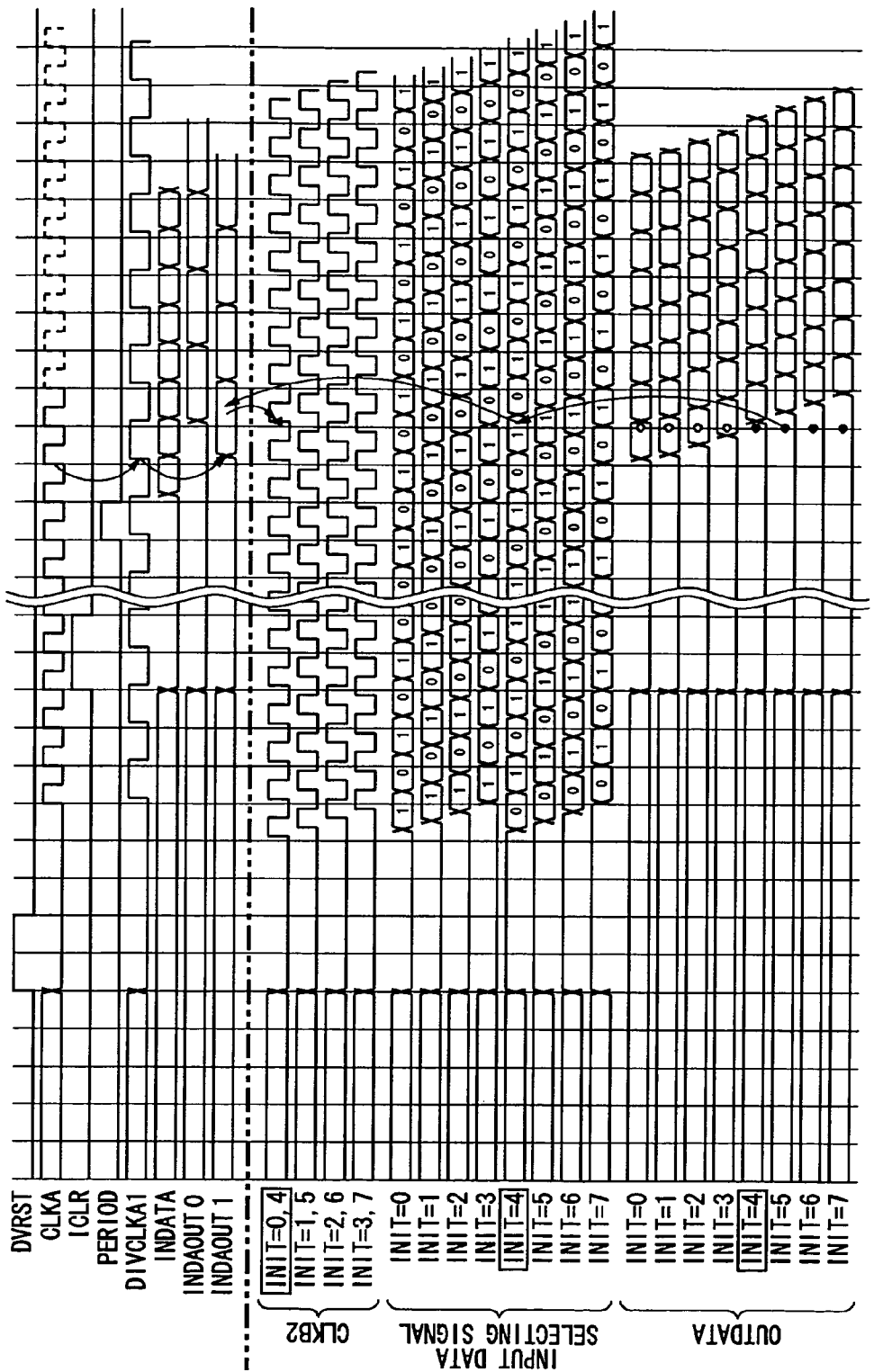
FIG. 10 is a timing chart explaining an initialization operation of a clock transferring section when a phase of CLKA and a phase of CLKB2 are most deviated from each other.

FIG. 10 is a timing chart explaining an initialization operation of the clock transferring section 206 when the phase of CLKA and the phase of CLKB2 are most deviated from each other. In this example, the phase controlling section 250 outputs the CLKA to the clock generating section 104, e.g., by three clocks using the generation of PERIOD as a standard, and stops the CLKA. Then, the judging section 244 compares the acquired RDT with an expected value to judge a pass or a fail. In the present drawing, when the phase controlling section 250 changes the value of INIT from three to four to change the phase of CLKB2, the judgment result by the judging section 244 is changed from a pass to a fail. The phase controlling section 250 sets the value of INIT to four, and terminates the initialization operation.

When the value of INIT is four, since the state of the input data selecting signal corresponding to a third clock CLKA becomes one after the generation of the PERIOD, the rising edge of CLKB2 at this time corresponds to the INDAOUT1. In this case, the rising edge of CLKB2 is located at the substantially middle position on an open part of eye of the INDAOUT1. Therefore, in this example, the phase of CLKB2 is most suitable when the value of INIT is four.

Figure 11:
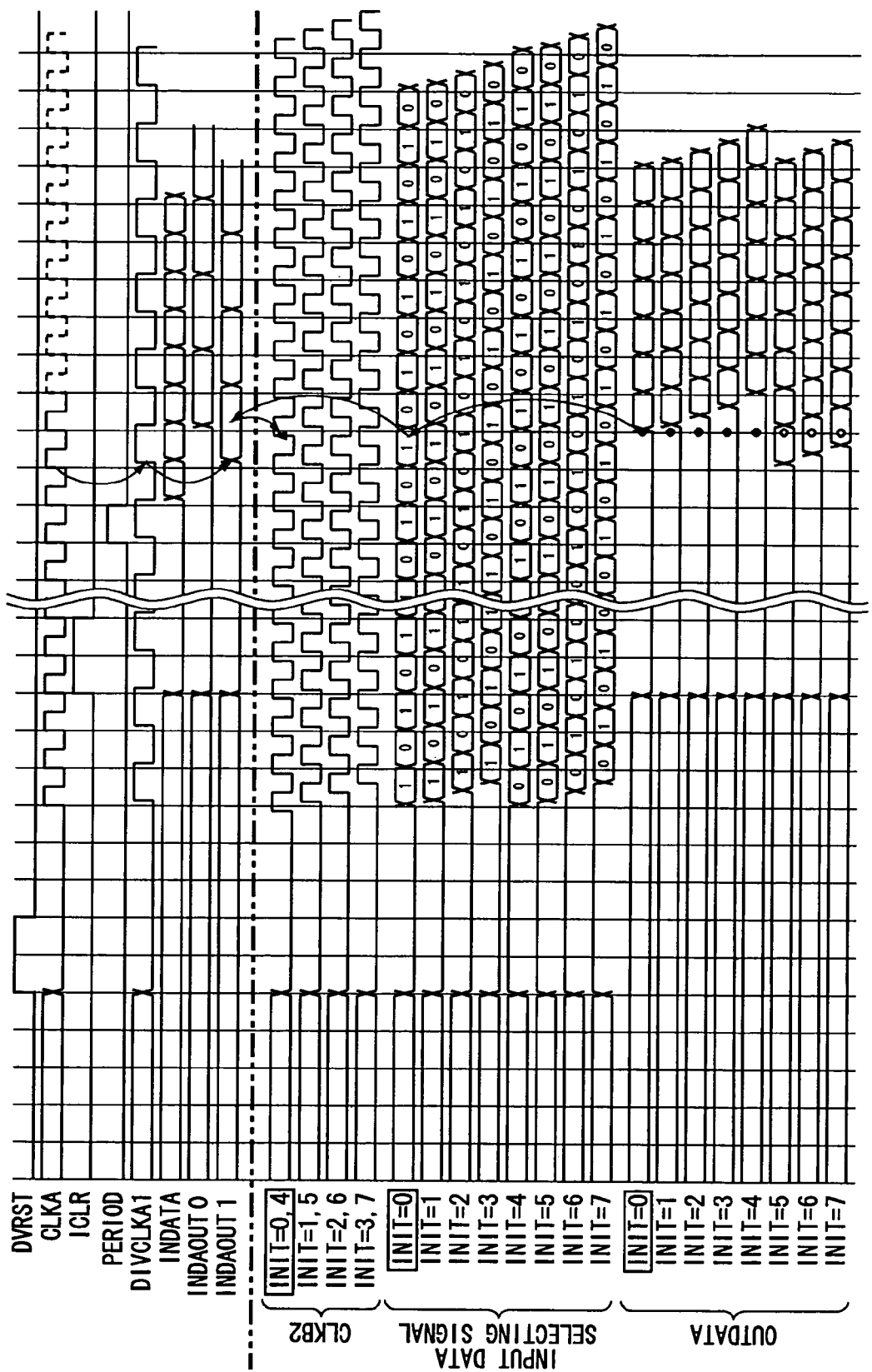
FIG. 11 is a timing chart explaining an initialization operation of a clock transferring section when a phase of CLKA and a phase of CLKB2 come closest to each other.

FIG. 11 is a timing chart explaining an initialization operation of the clock transferring section 206 when the phase of CLKA and the phase of CLKB2 come closest to each other. In this example, the phase controlling section 250 detects a fail of the RDT when the value of the first INIT is zero. However, since the phase controlling section 250 initializes the previous judgment result of the RDT to a fail, the phase controlling section 250 does not detect the change from a pass to a fail. Then, the phase controlling section 250 receives the judgment result of a pass from the judging section 244 when the value of INIT is five. After that, the phase controlling section 250 detects the change from a pass to a fail by receiving the judgment result when the value of INIT is zero. The phase controlling section 250 sets the value of INIT to zero, and terminates the initialization operation.

When the value of INIT is zero, since the state of the input data selecting signal corresponding to the third clock CLKA becomes one after the generation of the PERIOD, the rising edge of CLKB2 at this time corresponds to the INDAOUT1. In this case, the rising edge of CLKB2 is located at the substantially middle position on an open part of eye of the INDAOUT1. Therefore, in this example, the phase of CLKB2 is most suitable when the value of INIT is zero.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

INDUSTRIAL APPLICABILITY

As apparent from the above descriptions, according to a clock transferring apparatus of the present invention, since it is not necessary to consider the length of a pattern, the length of a cable, and the variation of a process by fitting a phases of a clock by means of a control circuit, it is possible to reduce the number of phases in an interleave circuit. Therefore, it is possible to reduce the number of design processes and power consumption. Moreover, since it is not necessary to provide a variable delay circuit every signal line, it is possible to reduce time necessary for initialization.

What is claimed is:

1. A clock transferring apparatus that outputs input data given in synchronization with a transmission clock in synchronization with an internal clock having a phase different from that of the transmission clock, the clock transferring apparatus comprising:
a comparison clock generating section that generates a comparison clock of which each clock rising edge or each clock falling edge coincides with substantially the middle position of an eye opening of the input data based on the transmission clock;
an initializing section that controls a phase of the internal clock so that the phase of the internal clock is substantially the same as a phase of the comparison clock; and
a data outputting section that receives the internal clock whose phase is controlled by said initializing section and the input data, synchronizes the input data with the internal clock, and outputs the synchronized data as output data.

2. The clock transferring apparatus as claimed in claim 1, wherein
the clock transferring apparatus further comprises an input data acquiring section that generates the input data changed in synchronization with a clock rising edge or a clock falling edge of the transmission clock by acquiring the input data in synchronization with the rising edge or the falling edge of the transmission clock and outputs the generated data to said data outputting section, and
said comparison clock generating section generates the comparison clock of which each clock rising edge or each clock falling edge coincides with substantially the middle position of an eye opening of the input data output from said input data acquiring section by delaying the transmission clock by a half cycle.

3. The clock transferring apparatus as claimed in claim 1, wherein said initializing section comprises:
a judging section that acquires the output data output from said data outputting section in synchronization with the comparison clock and judges a pass or a fail of the output data by comparing the acquired output data and a previously stored expected value of the output data;
a phase controlling section that generates a phase setting signal for setting a phase based on the judgment result judged by the judging section; and
a phase setting section that sets the phase of the internal clock based on the phase setting signal generated by said phase controlling section, makes said data outputting section output the output data according to the internal clock whose phase is set, and makes the judging section judge the output data in correspondence with the set phase of the internal clock, and
the phase controlling section sequentially changes the phase setting signal to make the phase setting section sequentially change the phase of the internal clock, receives the comparison result by the judging section corresponding to each changed phase, and stops changing the phase setting signal to substantially adjust the phase of the internal clock with the phase of the comparison clock when the judgment result is changed from a pass to a fail.

4. The clock transferring apparatus as claimed in claim 3, wherein the phase setting section comprises:
a reference clock generating section that generates a reference clock whose frequency is an integer multiple of that of the internal clock;
a phase change clock generating section that generates a divided reference clock having substantially the same frequency as the internal clock made by dividing the reference clock generated by the reference clock generating section, an inverted divided reference clock made by inverting the divided reference clock, and a plurality of phase retardation reference clocks made by delaying a phase of the divided reference clock and a phase of the inverted divided reference clock by one cycle of the reference clock; and
a phase change clock selecting section that selects either the divided reference clock, the inverted divided reference clock, or each of the phase retardation reference clocks generated by the phase change clock generating section based on the phase setting signal received from the phase controlling section, and outputs the selected clock to said data outputting section as the internal clock.

5. The clock transferring apparatus as claimed in claim 3, wherein
the phase setting section further generates an input data selecting signal varying in synchronization with the internal clock,
the clock transferring apparatus further comprises:
a rising-time data acquiring section that acquires the input data at a clock rising edge of a dividing transmission clock made by dividing the transmission clock and outputs the input data in synchronization with the clock rising edge of the dividing transmission clock;
a falling-time data acquiring section that acquires the input data at a clock falling edge of the dividing transmission clock and outputs the input data in synchronization with the clock falling edge of the dividing transmission clock; and an input data selecting section that alternately selects the input data output from said rising-time data acquiring section and said falling-time data acquiring section in synchronization with the input data selecting signal varying with substantially the same cycle as that of the dividing transmission clock and outputs the selected input data to said data outputting section, and said comparison clock generating section delays the transmission clock by one cycle to generate the comparison clock that is alternately located at substantially the middle position of each eye opening of the input data output from said rising-time data acquiring section and the input data output from said falling-time data acquiring section.

6. The clock transferring apparatus as claimed in claim 5, wherein the phase setting section comprises:

a reference clock generating section that generates a reference clock whose frequency is an integer multiple of that of the internal clock;

a phase change clock generating section that generates a divided reference clock having substantially the same frequency as the internal clock made by dividing the reference clock generated by the reference clock generating section, an inverted divided reference clock made by inverting the divided reference clock, and a plurality of phase retardation reference clocks made by delaying a phase of the divided reference clock and a phase of the inverted divided reference clock by one cycle of the reference clock;

a phase change clock selecting section that selects either the divided reference clock, the inverted divided reference clock, or the plurality of phase retardation reference clocks generated by the phase change clock generating section based on the phase selling signal received from the phase controlling section, and outputs the selected clock to said data outputting section as the internal clock;

a divided phase change clock selecting section that respectively generates divided phase change clocks made by respectively dividing the divided reference clock, the inverted divided reference clock, and the plurality of phase retardation reference clocks generated by the phase change clock generating section, selects one of the plurality of divided phase change clocks based on the phase setting signal received from the phase controlling section, and outputs the selected clock as a selected divided phase change clock; and a selection signal generating section that supplies either of the selected divided phase change clock and an inversion of the selected divided phase change clock output from the divided phase change clock selecting section to said input data selecting section as the input data selecting signal based on the phase setting signal received from the phase controlling section.

7. A test apparatus that tests an electronic device outputting an output signal and a transmission clock synchronized with the output signal, comprising:

a test pattern generating section that generates a test pattern to test the electronic device;

a timing generator that generates a desired timing;

a waveform shaping section that shapes a test signal to be input to the electronic device based on the test pattern and the timing generated by said timing generator;

a clock transferring section that receives the transmission clock and the output signal and synchronizes the received output signal with an internal clock of the test apparatus having a phase different from that of the transmission clock; and a test judging section that judges the good or bad of the electronic device based on the output signal synchronized with the internal clock by said clock transferring section, and said clock transferring section comprising:

a comparison clock generating section that generates a comparison clock of which each clock rising edge or each clock falling edge coincides with substantially the middle position of an eye opening of the output signal based on the transmission clock;

an initializing section that controls a phase of the internal clock so that the phase of the internal clock is substantially the same as a phase of the comparison clock; and a data outputting section that receives the internal clock whose phase is controlled by the initializing section and the output signal, synchronizes the output signal with the internal clock, and outputs the synchronized data.

* * * * *

UNITED STATES PATENT AND TRADEMARK OFFICE
CERTIFICATE OF CORRECTION

| | | |
|---|---|---|
| PATENT NO. | : 7,509,517 B2 | Page 1 of 1 |
| APPLICATION NO. | : 11/343949 | |
| DATED | : March 24, 2009 | |
| INVENTOR(S) | : Junichi Matsumoto et al. | |

It is certified that error appears in the above-identified patent and that said Letters Patent is hereby corrected as shown below:

In Claim 6, column 17, line 34 the word "selling" should be --setting--.

Signed and Sealed this

Second Day of June, 2009

JOHN DOLL
*Acting Director of the United States Patent and Trademark Office*